United States Patent
Yokota et al.

(10) Patent No.: US 9,978,566 B2
(45) Date of Patent: May 22, 2018

(54) PLASMA ETCHING METHOD

(71) Applicant: TOKYO ELECTRON LIMITED, Tokyo (JP)

(72) Inventors: Akihiro Yokota, Miyagi (JP); Shinji Himori, Miyagi (JP); Tatsuro Ohshita, Miyagi (JP); Shu Kusano, Miyagi (JP); Etsuji Ito, Miyagi (JP); Kazuya Nagaseki, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days. days.

(21) Appl. No.: 15/288,205

(22) Filed: Oct. 7, 2016

(65) Prior Publication Data
US 2017/0103877 A1   Apr. 13, 2017

(30) Foreign Application Priority Data
Oct. 9, 2015 (JP) ................................. 2015-200877

(51) Int. Cl.
*H01J 37/32* (2006.01)
*H01L 21/67* (2006.01)

(52) U.S. Cl.
CPC .... *H01J 37/32669* (2013.01); *H01J 37/3244* (2013.01); *H01J 37/32091* (2013.01); *H01J 37/32715* (2013.01); *H01L 21/67069* (2013.01); *H01J 2237/334* (2013.01)

(58) Field of Classification Search
CPC ........... H01J 37/32669; H01J 37/32091; H01J 37/3244; H01J 37/32715; H01L 21/67069
See application file for complete search history.

(56) References Cited

U.S. PATENT DOCUMENTS 5,932,488 A * 8/1999 Takizawa .......... H01L 21/32137
                                                   216/69
2014/0346040 A1* 11/2014 Yokota .............. H01J 37/32091
                                                   204/298.37

FOREIGN PATENT DOCUMENTS

JP            2014-158005 A       8/2014

* cited by examiner

*Primary Examiner* — Duy Vu N Deo
(74) *Attorney, Agent, or Firm* — Rothwell, Figg, Ernst & Manbeck, P.C.

(57) ABSTRACT

Disclosed is a plasma etching method which is performed using a plasma processing apparatus that is a capacitively coupled plasma processing apparatus, and includes: a processing container; a gas supply unit that supply an etching processing gas into the processing container; a placing table including a lower electrode; an upper electrode provided above the placing table; and a plurality of electromagnets including a plurality of coils, or a plurality of electromagnets each including a coil, on the upper electrode. The plasma etching method includes generating plasma of the processing gas to perform a plasma etching on a single film of a workpiece placed on the placing table; and controlling a current supplied to the plurality of electromagnet to change a distribution of an etching rate of the single film in the diametric direction with respect to the central axis during the generating of the plasma of the processing gas.

6 Claims, 13 Drawing Sheets

PLASMA ETCHING METHOD

CROSS-REFERENCE TO RELATED APPLICATIONS

This application is based on and claims priority from Japanese Patent Application No. 2015-200877 filed on Oct. 9, 2015 with the Japan Patent Office, the disclosure of which is incorporated herein in its entirety by reference.

TECHNICAL FIELD

An exemplary embodiment of the present disclosure relates to a plasma etching method.

BACKGROUND

In manufacturing electronic devices, a plasma etching may be performed on a film of a workpiece. A plasma processing apparatus used in the plasma etching may be a capacitively coupled plasma processing apparatus. Generally, the capacitively coupled plasma processing apparatus includes a processing container, a placing table, an upper electrode, and a gas supply unit. The placing table includes a lower electrode, and is configured to support the workpiece within the processing container. The upper electrode is provided above the placing table. The gas supply unit is configured to supply a gas into the processing container. In the capacitively coupled plasma processing apparatus, a processing gas is supplied into the processing container from the gas supply unit, and the processing gas is excited by a high frequency electric field formed between the upper electrode and the lower electrode. Accordingly, plasma is generated. Then, the film of the workpiece is etched by active species of molecules and/or atoms constituting the processing gas.

The capacitively coupled plasma processing apparatus may include a plurality of electromagnets above the upper electrode. For example, the plurality of electromagnets are formed of a plurality of coils provided coaxially around a central axis passing through the center of the placing table in the vertical direction. Alternatively, the plurality of electromagnets are arranged along a plurality of concentric circles around the central axis and in the radial direction. Each electromagnet includes a coil provided around the axis extending in the vertical direction. The plurality of electromagnets are used to adjust a diametric distribution of the density of the plasma generated within the processing container, thereby adjusting a distribution of the etching rate in the diametric direction of the film of the workpiece. The etching of the film using such a plasma processing apparatus is described in, for example, Japanese Patent Laid-Open Publication No. 2014-158005.

SUMMARY

According to an aspect, the present disclosure provides a plasma processing method using a plasma processing apparatus. The plasma processing apparatus is a capacitively coupled plasma processing apparatus, and includes a processing container, a gas supply unit, a placing table, an upper electrode, and a plurality of electromagnets. The gas supply unit is configured to supply an etching processing gas into the processing container. The placing table includes a lower electrode provided in the processing container. The upper electrode is provided above the placing table. The plurality of electromagnets are provided on the upper electrode. The plurality of electromagnets are formed of a plurality of coils provided coaxially around a central axis passing through the center of placing table in the vertical direction. Alternatively, the plurality of electromagnets are arranged along a plurality of concentric circles around the central axis and in the radial direction. Each electromagnet is provided around the axis extending in the vertical direction. The plasma etching method according to an aspect includes (i) generating plasma of the processing gas to perform a plasma etching on a single film of a workpiece placed on the placing table; and (ii) controlling a current supplied to the plurality of electromagnet to change a distribution of an etching rate of the single film in the diametric direction with respect to the central axis during the generating of the plasma of the processing gas.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
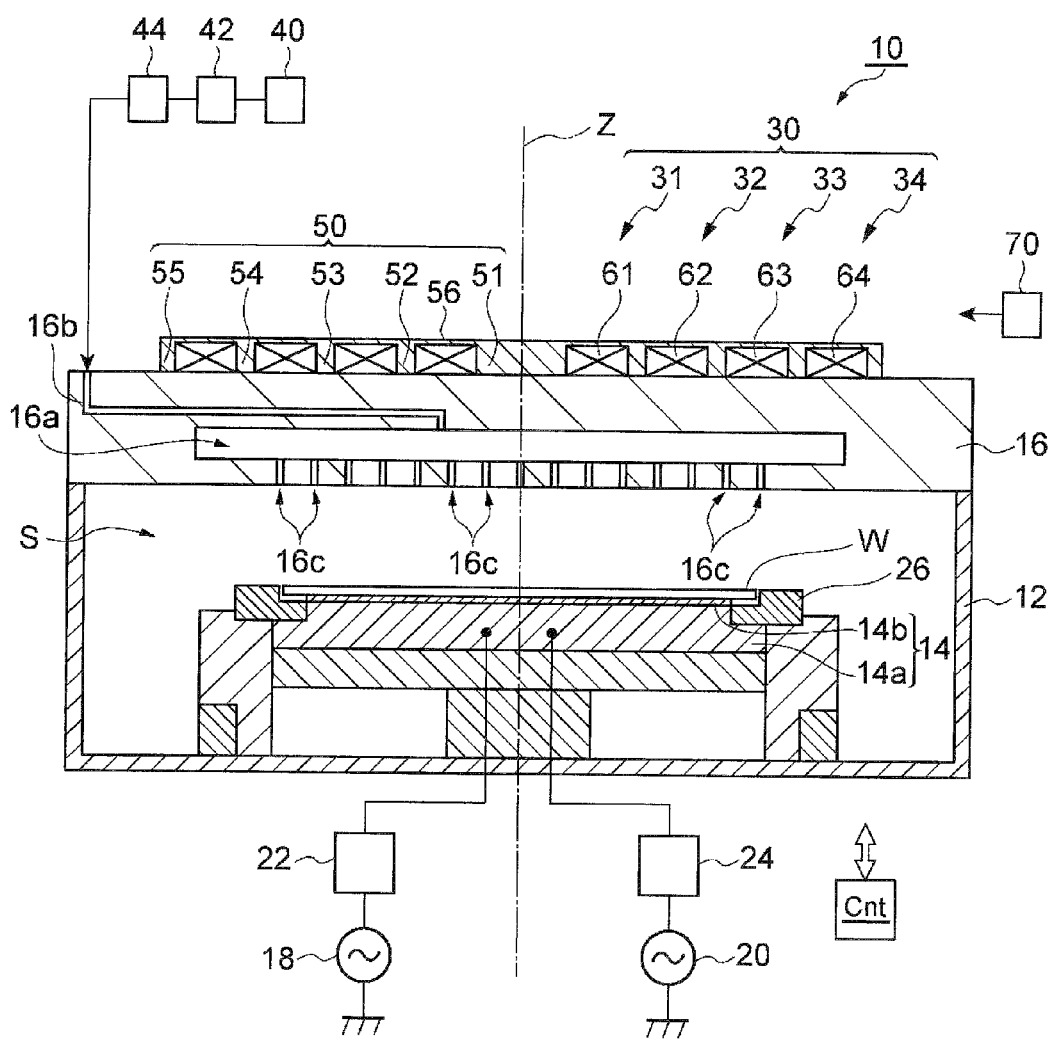
FIG. 1 is a schematic view illustrating a plasma processing apparatus which may be used in a plasma etching method according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the technique disclosed in Japanese Patent Laid-Open Publication No. 2014-158005, during the etching of a single film, a current supplied to respective coils of a plurality of electromagnets is constant. That is, during the etching of a single film, a magnetic field formed in the processing container is fixed. Accordingly, during the etching of a single film, a distribution of an etching rate of the film in the diametric direction is also fixed.

In the technique disclosed in Japanese Patent Laid-Open Publication No. 2014-158005, a local peak may occur in the distribution of the etching rate of the film in the diametric direction. It is presumed that the reason is because confinement of electrons occurs remarkably along a magnetic force line in a site where the strength of the horizontal magnetic field component and the vertical magnetic field component become substantially equal to each other.

From the background, it is required to enhance the controllability of the distribution of the etching rate of the film in the diametric direction. As a measure to enhance the controllability of the distribution of the etching rate of the film in the diametric direction, it is considered to arrange a greater number of electromagnets in a predetermined region where the electromagnets may be arranged. However, in the measure, an allowable area of the region where each electromagnet is arranged is reduced, so that the number of turns of the coil of each electromagnet is reduced. In order to increase the strength of the magnetic field generated by an electromagnet with a small number of turns, it is necessary to increase the current supplied to the coil of each electromagnet. Thus, another measure is required to enhance the controllability of the distribution of the etching rate of the film in the diametric direction.

According to an aspect, the present disclosure provides a plasma processing method using a plasma processing apparatus. The plasma processing apparatus is a capacitively coupled plasma processing apparatus, and includes a processing container, a gas supply unit, a placing table, an upper electrode, and a plurality of electromagnets. The gas supply unit is configured to supply an etching processing gas into the processing container. The placing table includes a lower electrode provided in the processing container. The upper electrode is provided above the placing table. The plurality of electromagnets are provided on the upper electrode. The plurality of electromagnets are formed of a plurality of coils provided coaxially around a central axis passing through the center of placing table in the vertical direction. Alternatively, the plurality of electromagnets are arranged along a plurality of concentric circles around the central axis and in the radial direction. Each electromagnet is provided around the axis extending in the vertical direction. The plasma etching method according to an aspect includes (i) generating plasma of the processing gas to perform a plasma etching on a single film of a workpiece placed on the placing table; and (ii) controlling a current supplied to the plurality of electromagnet to change a distribution of an etching rate of the single film in the diametric direction with respect to the central axis during the generating of the plasma of the processing gas.

In the above-described method, the current supplied to the coils of the plurality of electromagnets is controlled during the step of generating the plasma of the processing gas, so that the distribution of the etching rate of the single film in the diametric direction is changed. Therefore, in the method, the distribution of the etching rate is caused by addition of distribution of a plurality of etching rates of the single film in the diametric direction. That is, it is possible to obtain the distribution of the etching rate in the diametric direction, which cannot be obtained when the current supplied to respective coils of the plurality of electromagnets during the etching of the single film is fixed. Therefore, the above-described method is excellent in controllability of the distribution of the etching rate of the film in the diametric direction.

In an exemplary embodiment, in the controlling of the current supplied to the plurality of electromagnets, a first step of setting the current supplied to the plurality of electromagnets to etch the single film with a distribution of a first etching rate as the distribution of the etching rate and a second step of setting the current supplied to the plurality of electromagnets to etch the single film with a distribution of a second etching rate different form the first distribution of the first etching rate, as the distribution of the etching rate, may be alternately performed.

In an exemplary embodiment, the controlling of the current supplied to the plurality of electromagnets may include a plurality of steps of setting the current supplied to the plurality of electromagnets to sequentially etch the single film with a plurality of different etching rates in the diametric direction. Further, a sequence including the plurality of steps may be repeated.

As described above, the controllability of the distribution of the etching rate of the film in the diametric direction is enhanced.

Hereinafter, various exemplary embodiments will be described in detail with reference to the drawings. Meanwhile, in the respective drawings, the same or corresponding parts will be denoted by the same symbols.

First, a plasma processing apparatus, which may be used in a plasma etching method according to an exemplary embodiment, will be described. FIG. 1 is a schematic view illustrating a plasma processing apparatus which may be used in a plasma etching method according to an exemplary embodiment. The plasma processing apparatus 10 illustrated in FIG. 1 is a capacitively coupled plasma processing apparatus. The plasma processing apparatus 10 includes a processing container 12, a placing table 14, an upper electrode 16, a high frequency power source 18, and a high frequency power source 20.

The processing container 12 has a substantially cylindrical shape, and provides a processing space S therein. The processing space S is decompressible by an exhaust device. The placing table 14 is provided within the processing container 12. The placing table 14 includes a base 14a and an electrostatic chuck 14b. The base 14a is made of a conductive material such as, for example, aluminum, and has a substantially disc shape.

The electrostatic chuck 14b is provided on the base 14a. Further, a focus ring 26 is provided in a peripheral region of the top surface of the base 14a to surround a wafer W. The electrostatic chuck 14b includes, for example, an electrode provided as an inner layer of an insulating film, and has a substantially disc shape. The electrode of the electrostatic chuck 14b is supplied with a DC voltage from a DC power source via a switch. When the DC voltage is supplied to the electrode of the electrostatic chuck 14b, the electrostatic chuck 14b generates an electrostatic force. By the electrostatic force, a workpiece (hereinafter, referred to as a "wafer W") placed on the electrostatic chuck 14b is adsorbed onto the electrostatic chuck 14b. In the state where the wafer W is placed on the electrostatic chuck 14b, the center of the wafer W is positioned on a central axis Z passing through the center of the placing table 14 or the center of the electrostatic chuck 14b in the vertical direction. Meanwhile, the wafer W may have a diameter of, for example, 300 mm.

The base 14a constitutes a lower electrode. The base 14a is connected with a high frequency power source 18 that generates first high frequency waves for plasma generation, via a matcher 22. The high frequency power source 18 generates first high frequency waves having a frequency of, for example, 100 MHz. The matcher 22 includes a matching circuit to match the output impedance of the high frequency power source 18 and the impedance of the load side (the lower electrode side). Meanwhile, the high frequency power source 18 may be connected to the upper electrode 16.

Further, the base 14a is connected with a high frequency power source 20 that generates second high frequency waves for ion attraction, via a matcher 24. The high frequency power source 20 generates second high frequency waves having a frequency of, for example, 3.2 MHz. The matcher 24 includes a matching circuit to match the output impedance of the high frequency power source 20 and the impedance of the load side (the lower electrode side).

The upper electrode 16 is provided above the placing table 14 to face the placing table 14 through the processing space S. The upper electrode 16 has a substantially disc shape. The upper electrode 16 also functions as a shower head. In the exemplary embodiment, the upper electrode 16 is formed with a buffer chamber 16a, a gas line 26b, and a plurality of gas holes 26c. The buffer chamber 16a is connected with the plurality of gas holes 26c. The gas holes 26c extend downward, and are opened to the processing space S.

Further, the buffer chamber 16a is connected with one end of the gas line 16b. The gas line 16b is connected with a gas source group 40 via a valve group 42 and a flow rate controller group 44. The gas source group 40, the valve group 42, and the flow rate controller group 44 constitute a gas supply unit that supplies an etching processing gas into the processing container 12. The gas source group 40 includes a plurality of gas sources. The valve group 42 includes a plurality of valves. The flow rate controller group 44 includes a plurality of flow rate controllers such as mass flow controllers or pressure control type flow rate controllers. Each of the plurality of gas sources of the gas source group 40 are connected to the gas line 16b via a valve corresponding to the valve group 42 and a flow rate controller corresponding to the flow rate controller group 44.

During the operation of the plasma processing apparatus 10, a processing gas from the gas supply unit is supplied into the processing container 12. Further, the pressure of the space in the processing container 12 is decompressed by an exhaust device. In addition, the first high frequency waves are supplied from the high frequency power source 18 to the lower electrode (or the upper electrode 16). Therefore, plasma of the processing gas is generated in the processing space S. Then, the film of the wafer W is etched by active species of molecules or atoms constituting the processing gas, which are dissociated in the plasma. In addition, a degree of ion attraction may be adjusted by adjusting the power of the second high frequency waves imparted from the high frequency power source 20 to the lower electrode.

Figure 2:
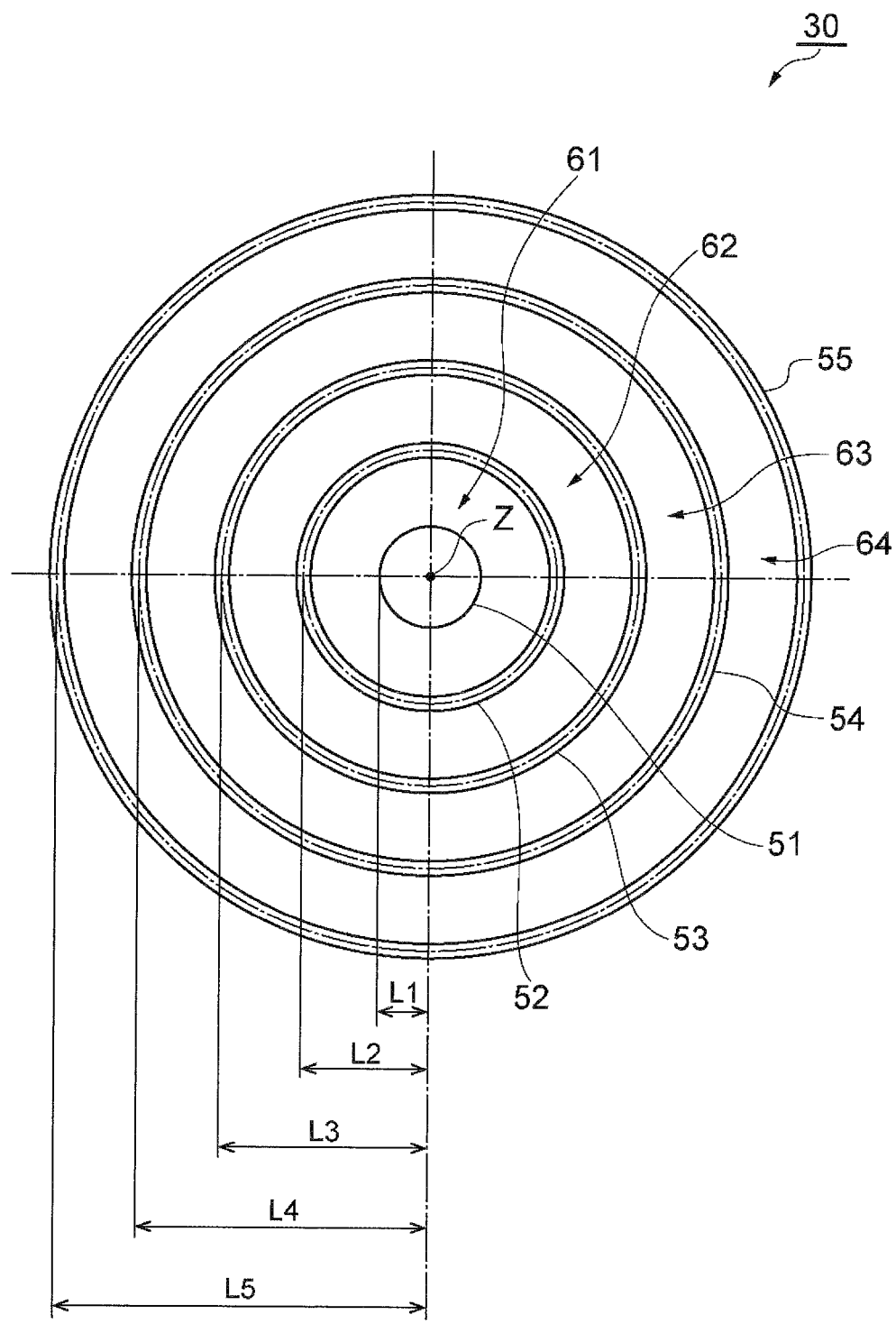
FIG. 2 is a plan view of a plurality of electromagnets of the plasma processing apparatus illustrated in FIG. 1.

Further, the plasma processing apparatus 10 includes a plurality of electromagnets 30. FIG. 2 is a plan view of a plurality of electromagnets of the plasma processing apparatus illustrated in FIG. 1. FIG. 2 illustrates a plan view of the plurality of electromagnets 30 when viewed from the processing space S side in the vertical direction. As illustrated in FIGS. 1 and 2, the plurality of electromagnets 30 are provided on the upper electrode 16, that is, a ceiling of the processing container 12. In an example, the plurality of electromagnets 30 include electromagnets 31 to 34, and are constituted by a core member 50 and a plurality of coils 61 to 64.

The core member 50 has a structure in which a columnar portion 51, a plurality of cylindrical portions 52 to 55, and a base portion 56 are formed integrally, and is made of a magnetic material. The base portion 56 has a substantially disc shape, and the central axis thereof coincides with the central axis Z. The columnar portion 51 and the plurality of cylindrical portions 52 to 55 extend downward from the bottom surface of the base portion 56. The columnar portion 51 has a substantially columnar shape, and the central axis thereof substantially coincides with the central axis Z. A radius L1 of the columnar portion 51 is, for example, 30 mm. The plurality of cylindrical portions 52 to 55 are provided outside the columnar portion 51 with respect to the central axis Z.

Each of the cylindrical portions 52 to 55 has a cylindrical shape extending in the vertical direction. The central axes of the cylindrical portions 52 to 55 substantially coincide with the central axis Z. That is, the cylindrical portions 52 to 55 are provided coaxially. A radius L2 of the cylindrical portion 52, a radius L3 of the cylindrical portion 53, a radius L4 of the cylindrical portion 54, and a radius L5 of the cylindrical portion 55 are greater than the radius L1, and have a relationship of L2<L3<L4<L5. For example, the radius L2, the radius L3, the radius L4, and the radius L5 are 76 mm, 127 mm, 178 mm, and 229 mm, respectively. Meanwhile, the radius L2 is a distance between the central axis Z and an intermediate position in the diametric direction between the inner circumferential surface and the outer circumferential surface of the cylindrical portion 52. The radius L3 is a distance between the central axis Z and an intermediate position in the diametric direction between the inner circumferential surface and the outer circumferential surface of the cylindrical portion 53. The radius L4 is a distance between the central axis Z and an intermediate position in the diametric direction between the inner circumferential surface and the outer circumferential surface of the cylindrical portion 54. The radius L5 is a distance between the central axis Z and an intermediate position in the diametric direction between the inner circumferential surface and the outer circumferential surface of the cylindrical portion 55.

A groove is formed between the columnar portion 51 and the cylindrical portion 52. A coil 61 wound along the outer circumferential surface of the columnar portion 51 is accommodated in the groove. A groove is also formed between the cylindrical portion 52 and the cylindrical portion 53, and a coil 62 wound along the outer circumferential surface of the cylindrical portion 52 is accommodated in the groove. In addition, a groove is also formed between the cylindrical portion 53 and the cylindrical portion 54, and a coil 63 wound along the outer circumferential surface of the cylindrical portion 53 is accommodated in the groove. In addition, a groove is also formed between the cylindrical portion 54 and the cylindrical portion 55, and a coil 64 wound along the outer circumferential surface of the cylindrical portion 54 is accommodated in the groove. Therefore, the coils 61 to 64 are provided coaxially around the central axis Z. Both ends of each of the coils 61 to 64 are connected to a current source 70. The supply of the current from the current source 70 to each of the coils 61 to 64 and the stop of the supply, the direction of the current, and the current value may be controlled by a control signal from a controller Cnt. Meanwhile, the current supplied from the current source 70 to the coils 61 to 64 is, for example, a DC current, but not limited thereto.

In the plasma processing apparatus 10, the electromagnet 31 is constituted by the coil 61 and the columnar portion 51. Further, the electromagnet 32 is constituted by the coil 62, the columnar portion 51, and the cylindrical portion 52. The electromagnet 33 is constituted by the coil 63, the columnar portion 51, and the cylindrical portions 52 and 53. Further, the electromagnet 34 is constituted by the coil 63, the columnar portion 51, and the cylindrical portions 52 to 54.

Each of the plurality of electromagnets 30 generates a magnetic field, which is axisymmetric with respect to the central axis Z, within the processing container 12. Accordingly, a synthetic magnetic field, which is formed by each of the plurality of electromagnets 30, is formed in the processing container 12. The synthetic magnetic field is also axisymmetric with respect to the central axis Z. Further, an intensity distribution (or the magnetic flux density) of the magnetic field in the diametric direction with respect to the central axis Z may be adjusted by controlling the current supplied to each of the plurality of electromagnets 30. Thus, the plasma processing apparatus 10 may adjust the distribution of the etching rate in the diametric direction of the film of the wafer W by adjusting the diametric distribution of the density of the plasma generated in the processing container 12.

Figure 3:
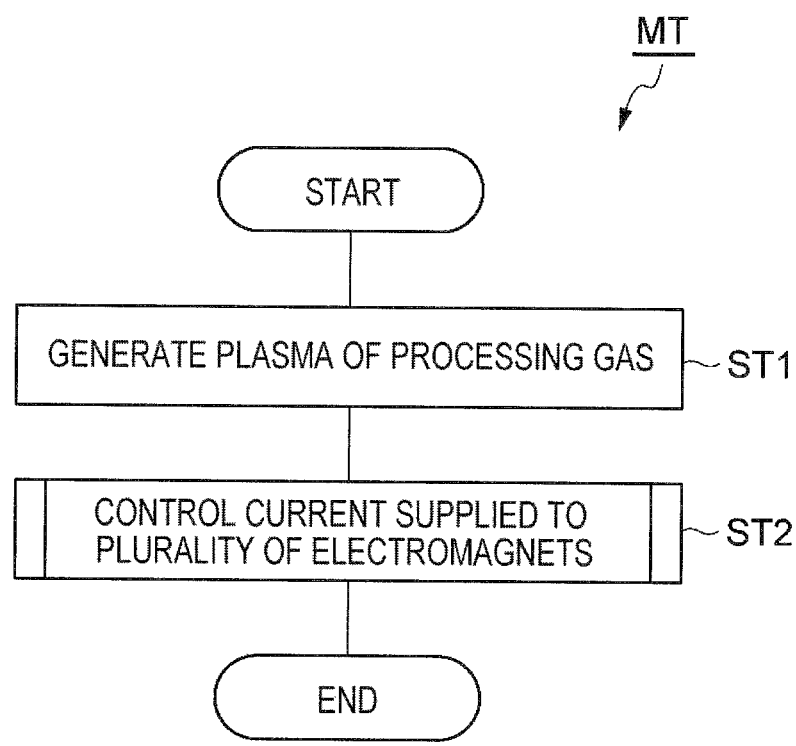
FIG. 3 is a flowchart illustrating a plasma etching method according to an exemplary embodiment.

Hereinafter, a plasma etching method according to an exemplary embodiment will be described. FIG. 3 is a flowchart illustrating a plasma etching method according to an exemplary embodiment. In the following, descriptions will be made on a case where the plasma etching method illustrated in FIG. 3 is performed using the plasma processing apparatus 10.

Figure 4:
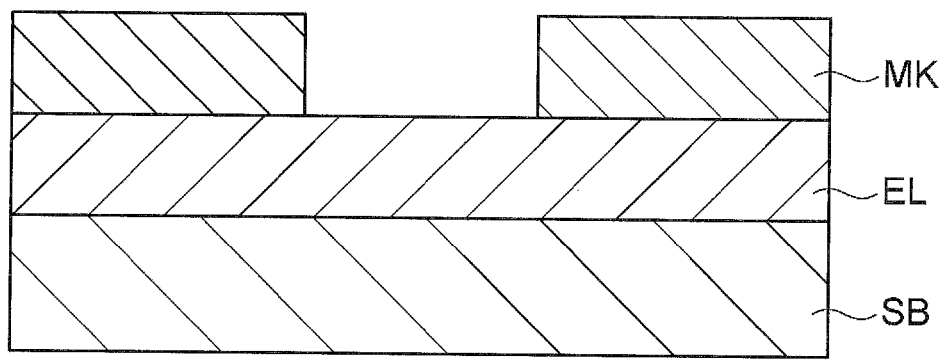
FIG. 4 is an enlarged cross-sectional view illustrating a part of an exemplary workpiece.

Method MT illustrated in FIG. 3 may be performed on, for example, a wafer W. FIG. 4 is an enlarged cross-sectional view illustrating a part of an exemplary workpiece. The wafer W illustrated in FIG. 4 includes a substrate SB, a film EL, and a mask MK. The film EL is formed on the substrate SB. The film EL may be any film, for example, a silicon oxide film. The mask MK is formed on the film EL. The mask MK is made of a material selected depending on the film EL. For example, the mask MK may be a resist mask, or a mask made of polycrystalline silicon.

In method MT, the wafer W is carried into the processing container 12 of the plasma processing apparatus 10, and the wafer W is placed on the placing table 14. Then, the wafer W is held by the electrostatic chuck 14b.

Thereafter, step ST1 is performed in method MT. In step ST1, plasma of a processing gas is generated. Specifically, the processing gas is supplied from the gas source group 40 into the processing container 12, and the pressure of the space in the processing container 12 is set to a predetermined pressure. In addition, first high frequency waves are supplied from the high frequency power source 18 to the lower electrode. Therefore, plasma of the processing gas is generated in the processing space S. Further, second high frequency waves are supplied from the high frequency power source 20 to the lower electrode to attract ions from the plasma of the processing gas.

In the subsequent step ST2, the current supplied to each coil of the plurality of electromagnets 30 is controlled during the generation of the processing gas in step ST1. Meanwhile, in the performance period of step ST2, the set power of the first high frequency waves and the set power of the second high frequency waves may be constant.

Thus, the distribution of the etching rate of the single film EL in the diametric direction with respect to the central axis Z is changed during the performance of step ST2. Therefore, during the performance of step ST2, the distribution of the etching rate is caused by the addition of a distribution of a plurality of etching rates of the single film in the diametric direction. That is, the distribution of the etching rate may be obtained in the diametric direction, which may not be obtained when the current supplied to respective coils of the plurality of electromagnets 30 during the etching of the single film EL is constant. For example, according to method MT, a variation in the etching rate in the diametric direction of the single film EL may be reduced as compared with a variation in the etching rate in the direction of the film EL when the current supplied to each coil of the plurality of electromagnets 30 is fixed. Thus, method MT is excellent in controllability of the distribution of the etching rate in the diametric direction.

Figure 5:
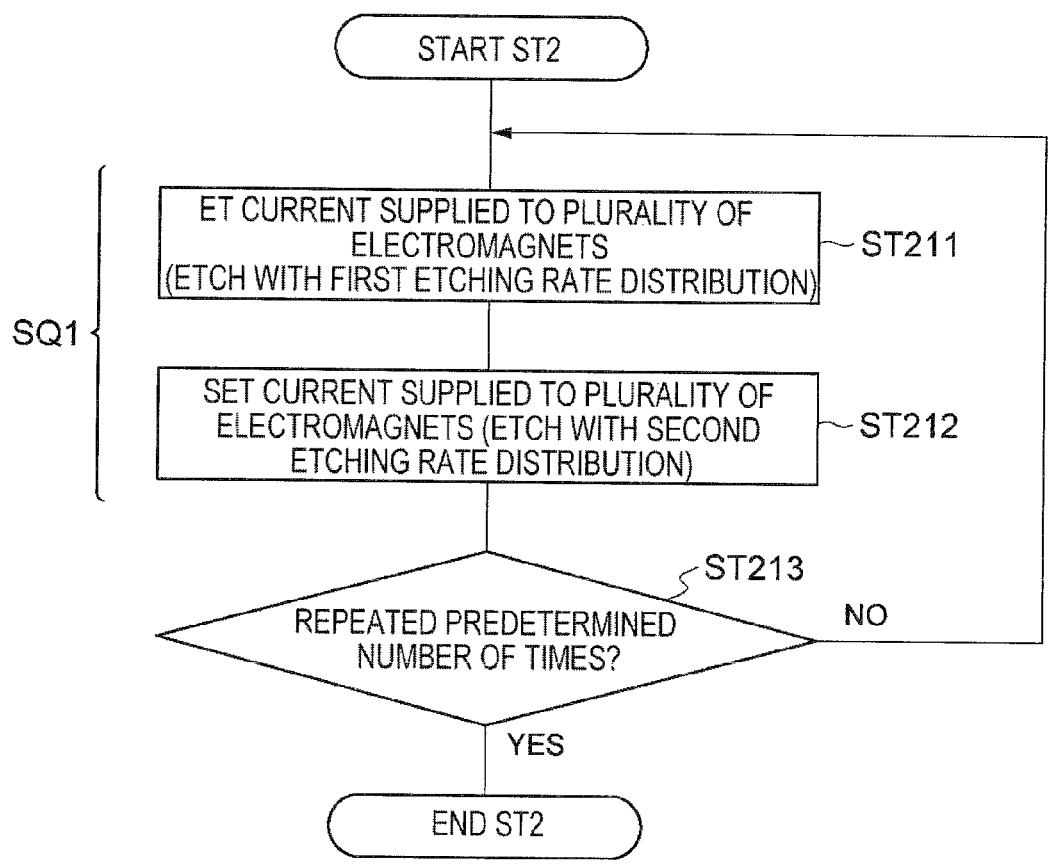
FIG. 5 is a flowchart illustrating an exemplary embodiment of step ST2 of the plasma etching method illustrated in FIG. 3.

Hereinafter, two exemplary embodiments about step ST2 will be described. FIG. 5 is a flowchart illustrating an exemplary embodiment of step ST2 of the plasma etching method illustrated in FIG. 3. Step ST2 illustrated in FIG. 5 includes step ST211 and step ST212. In step ST211, the current supplied to each coil of the plurality of electromagnets 30 is controlled so as to etch the film EL with a distribution of a first etching rate as the distribution of the etching rate of the film EL in the diametric direction. In the subsequent step ST212, the current supplied to each coil of the plurality of electromagnets 30 is controlled so as to etch the film EL with a distribution of a second etching rate, which is different from the first etching rate, as the distribution of the etching rate of the film EL in the diametric direction.

For example, in each of step ST211 and step ST212, the current supplied to each coil of the plurality of electromagnets 30 is controlled in such a manner in which the peak position of the etching rate in the diametric direction obtained in step ST211 and the peak position of the etching rate in the diametric direction obtained in step ST212 are different from each other.

In step ST2 illustrated in FIG. 5, a sequence SQ1 including step ST211 and step ST212 are performed a plurality of times. That is, step ST211 and step ST212 are performed alternately. Meanwhile, the performance time length of step ST211 and the performance time length of step ST212 in each time of the sequence SQ1 may be the same as or different from each other. The performance time length of step ST211 and the performance time length of step ST212 in each time of the sequence SQ1 may be set to a time length of, for example, 5 seconds or less.

Then, in step ST213, it is determined whether or not the sequence SQ1 is performed a predetermined number of times. When it is determined in step ST213 that the sequence SQ1 is not performed a predetermined number of times, the sequence SQ1 is performed again. Meanwhile, when it is determined in step ST213 that the sequence SQ1 is performed a predetermined number of times, step ST2 is ended.

As described above, when two steps of controlling the current supplied to each coil of the plurality of electromagnets 30 are alternately repeated to cause a distribution of different etching rates, it is possible to obtain the distribution of the etching rate in the diametric direction, which may not be obtained when the current supplied to respective coils of the plurality of electromagnets during the etching of the single film is fixed.

Figure 6:
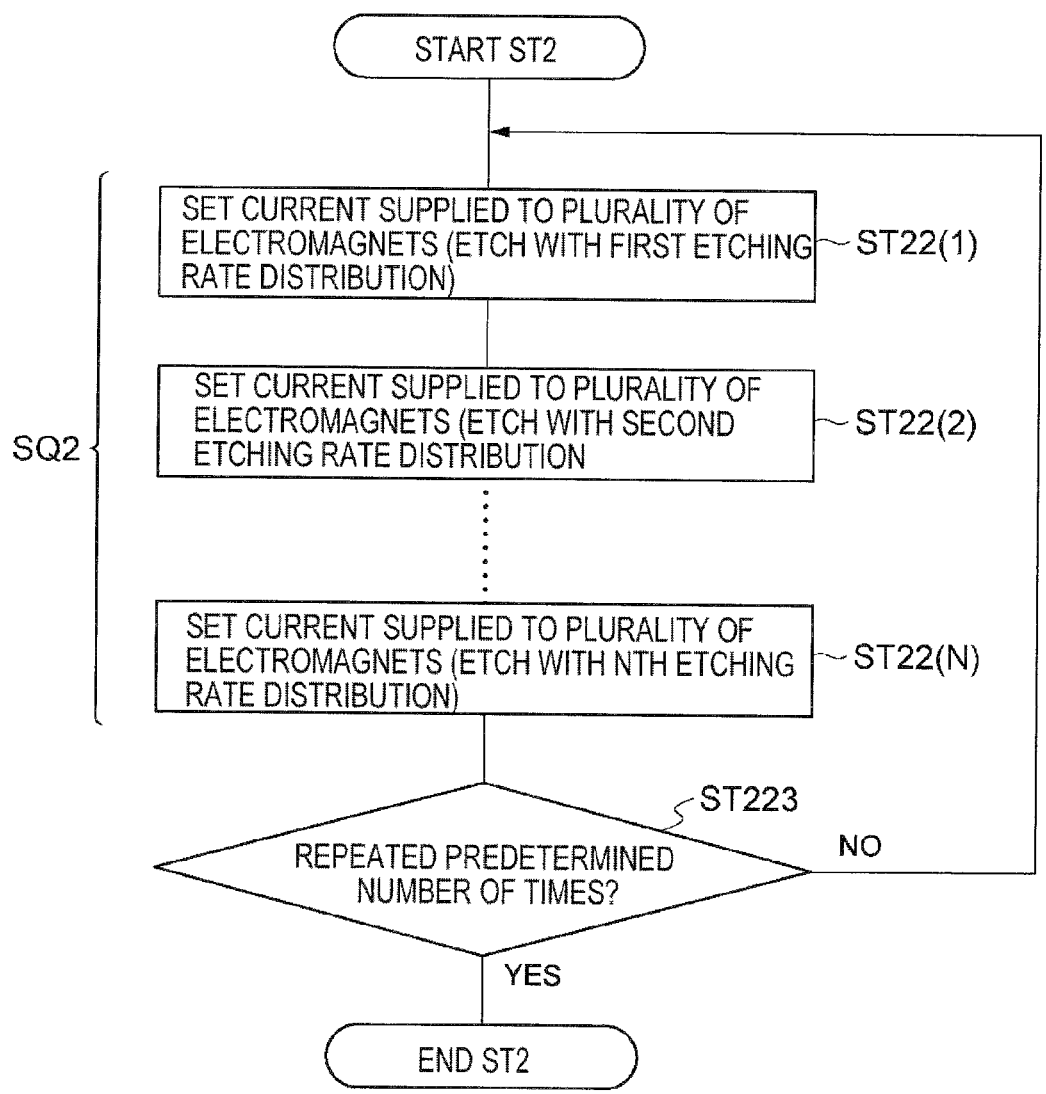
FIG. 6 is a flowchart illustrating another exemplary embodiment of step ST2 of the plasma etching method illustrated in FIG. 3.

FIG. 6 is a flowchart illustrating another exemplary embodiment of step ST2 of the plasma etching method illustrated in FIG. 3. Step ST2 illustrated in FIG. 6 includes a plurality of steps ST22(1) to ST22(N). The symbol "N" may be an integer of 3 or more. In the plurality of steps ST22(1) to ST22(N), the current supplied to each coil of the plurality of electromagnets 30 is set such that the film EL is etched sequentially with a distribution of a plurality of different etching rates in the diametric direction. For example, the current supplied to each coil of the plurality of electromagnets 30 is set in each of the plurality of steps ST22(1) to ST22(N) such that the peak of the etching rate of the film EL in the diametric direction is moved gradually to the edge side of the wafer W as the plurality of steps ST22(1) to ST22(N) are performed in sequence.

In step ST2 illustrated in FIG. 6, a sequence SQ2 including the plurality of steps ST22(1) to ST22(N) are performed a plurality of times. Meanwhile, each performance time length of the plurality of steps ST22(1) to ST22(N) in each time of the sequence SQ2 may be the same as or different from each other.

Then, in step ST223, it is determined whether or not the sequence SQ2 is performed a predetermined number of times. When it is determined in step ST223 that the sequence SQ2 is not performed a predetermined number of times, the sequence SQ2 is performed again. Meanwhile, when it is determined in step ST223 that the sequence SQ2 is performed a predetermined number of times, step ST2 is ended.

As described above, when a plurality of steps of controlling the current supplied to each coil of the plurality of electromagnets 30 are performed to cause a distribution of a plurality of different etching rates, it is possible to obtain the distribution of the etching rate in the diametric direction, which may not be obtained when the current supplied to respective coils of the plurality of electromagnets during the etching of the single film is fixed.

Figure 7:
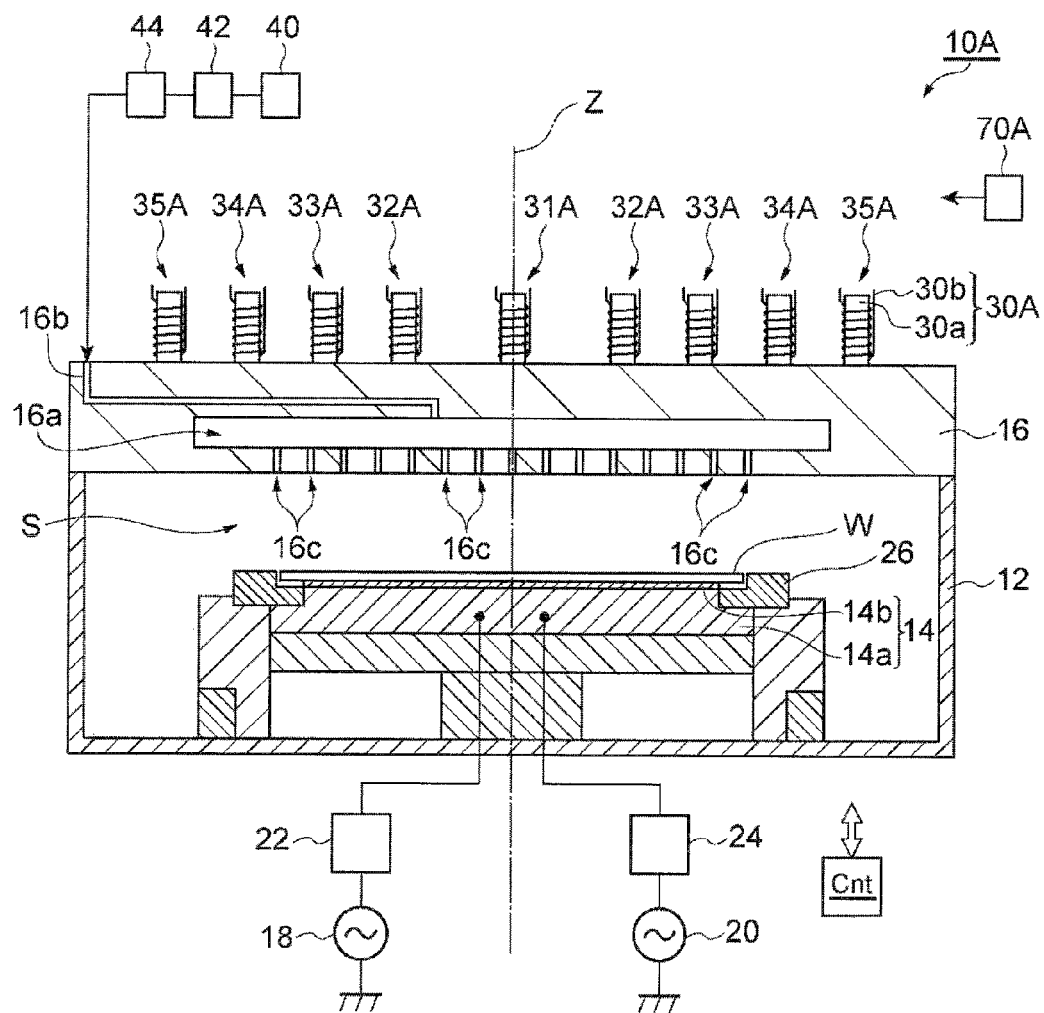
FIG. 7 is a schematic view illustrating another plasma processing apparatus which may be used in the plasma etching method according to the exemplary embodiment.
Figure 8:
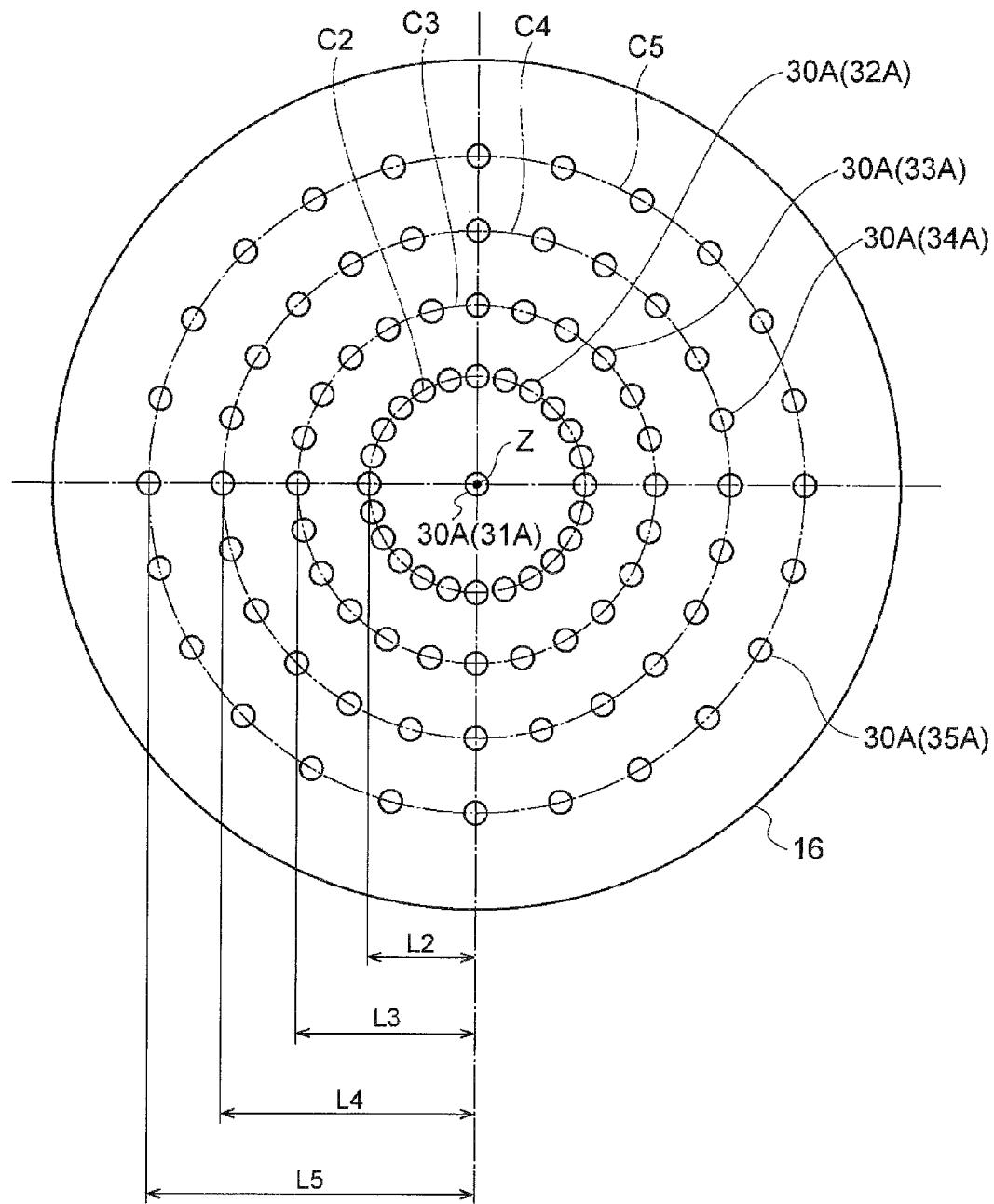
FIG. 8 is a plan view of the plasma processing apparatus illustrated in FIG. 7 when viewed from the top.

Hereinafter, another plasma processing apparatus, which may be used for performing method MT, will be described with reference to FIGS. 7 and 8. FIG. 7 is a schematic view illustrating a plasma processing apparatus which may be used in the plasma etching method according to an exemplary embodiment. FIG. 8 is a plan view of the plasma processing apparatus illustrated in FIG. 7 when viewed from the top.

The plasma processing apparatus 10A illustrated in FIGS. 7 and 8 is different from the plasma processing apparatus 10 in that a plurality of electromagnets 30A are provided in place of the plurality of electromagnets 30. Each of the plurality of electromagnets 30A includes a core 30a and a coil 30b. The core 30a is a columnar core, and extends in the vertical direction. The coil 30b is provided around the core 30a. That is, the coil 30b is provided around an axis extending in the vertical direction.

The plurality of electromagnets 30A are arranged along a plurality of concentric circles around the central axis Z and in the radial direction (diametric direction) with respect to the central axis Z. In the example illustrated in FIGS. 7 and 8, the plurality of electromagnets 30 are divided into a first group 31A, a second group 32A, a third group 33A, a fourth 34A, and a fifth group 35A, and each group includes several electromagnets 30A. The first group 31A may include one or more electromagnets 30A provided on the central axis A and in the vicinity thereof. In the example illustrated in FIGS. 7 and 8, the first group 31A includes one electromagnet 30A provided on the central axis Z.

Further, each of the second group 32A, the third group 33A, the fourth group 34A, and the fifth group 35A includes twenty four (24) electromagnets 30A. The plurality of electromagnets 30A included in the second group 32A are arranged on a circle C2 having a radius L2. The plurality of electromagnets 30A included in the third group 33A are arranged on a circle C3 having a radius L3. The plurality of electromagnets 30A included in the fourth group 34A are arranged on a circle C4 having a radius L4. The plurality of electromagnets 30A included in the fifth group 35A are arranged on a circle C5 having a radius L5. The radius L2, the radius L3, the radius L4, and the radius L5 have a relationship of L2<L3<L4<L5. For example, the radius L2, the radius L3, the radius L4, and the radius L5 are 76 mm, 127 mm, 178 mm, and 229 mm, respectively.

The coils 30b of the plurality of electromagnets 30A are supplied with a current from the current source 70. In the plasma processing apparatus 10A, the coils 30b of the plurality of electromagnets 30A that belong to the same group are supplied with a current of the same value in the same direction. The supply of the current to each coil 30b of the plurality of electromagnets 30A and the stop of the supply, the direction of the current, and the current value may be controlled by a control signal from a controller Cnt. Meanwhile, the current supplied from the current source 70 to each coil 30b is, for example, a DC current, but not limited thereto.

In the plasma processing apparatus 10A, a synthetic magnetic field, which is axisymmetric with respect to the central axis Z, is generated within the processing container 12 by the plurality of electromagnets 30A. Further, an intensity distribution (or the magnetic flux density) of the magnetic field in the diametric direction may be adjusted by controlling the current supplied to the electromagnets 30 of each group. Thus, the plasma processing apparatus 10A may adjust the distribution of the etching rate in the diametric direction of the film of the wafer W by adjusting the diametric distribution of the density of the plasma generated in the processing container 12. Therefore, the plasma processing apparatus 10A may also be used for the performance of method MT.

Hereinafter, descriptions will be made on test examples and simulations performed for evaluation of method MT.

TEST EXAMPLES 1 AND 2

In Test Examples 1 and 2, a 300 mm diameter wafer having a silicon oxide film was prepared, and the silicon oxide film was etched by method MT including step ST2 of FIG. 5 using the plasma processing apparatus 10. Conditions of each step in Test Examples 1 and 2 are as follows. In the following conditions, the current supplied to the coils (current value) is represented as a magnetomotive force of the coils. Further, in the following conditions, a negative magnetomotive force of the coils means that the coils are given with a current in an opposite direction to a current given to the coils when a positive magnetomotive force is generated in the coils.

<Conditions of Step ST1 in Test Examples 1 and 2>
Processing gas
  $N_2$ gas: 300 sccm
  $O_2$ gas: 15 sccm
First high frequency waves: 100 MHz, 1,800 W
Second high frequency waves: 13.56 MHz, 300 W
Pressure in processing container 12: 20 mT (2.666 Pa)
<Conditions of Step ST211 in Test Examples 1 and 2>
Magnetomotive force of coil 61: 0 (AT)
Magnetomotive force of coil 62: 0 (AT)
Magnetomotive force of coil 63: 764 (AT)
Magnetomotive force of coil 64: −720 (AT)
<Conditions of Step ST212 in Test Examples 1 and 2>
Magnetomotive force of coil 61: 1201 (AT)
Magnetomotive force of coil 62: −543 (AT)
Magnetomotive force of coil 63: 0 (AT)
Magnetomotive force of coil 64: −374 (AT)

<Conditions of Step ST2 in Test Example 1>
Performance time length of step ST211 in each sequence SQ1: 5 seconds
Performance time length of step ST212 in each sequence SQ1: 5 seconds
Number of times of performance of sequence SQ1: 18 times
<Conditions of Step ST2 in Test Example 2>
Performance time length of step ST211 in each sequence SQ1: 2 seconds
Performance time length of step ST212 in each sequence SQ1: 2 seconds
Number of times of performance of sequence SQ1: 45 times In addition, Comparative Test Example 1 was performed for comparison. In Comparative Test Example 1, a 300 mm diameter wafer having a silicon oxide film was prepared, and the silicon oxide film was etched using the plasma processing apparatus 10. In Comparative Test Example 1, the current for the coils 61 to 64 was not changed during the etching of the silicon oxide film. Conditions of Comparative Test Example 1 are as follows.
<Conditions of Comparative Test Example 1>
Processing gas
  $N_2$ gas: 300 sccm
  $O_2$ gas: 15 sccm
First high frequency waves: 1,800 W, 100 MHz
Second high frequency waves: 13.56 MHz, 300 W
Magnetomotive force of coil 61: 0 (AT)
Magnetomotive force of coil 62: 0 (AT)
Magnetomotive force of coil 63: 736 (AT)
Magnetomotive force of coil 64: −576 (AT)

Then, in each of Test Example 1, Test Example 2, and Comparative Test Example 1, the etching rate of the silicon oxide film was measured at a plurality of positions along the diameter of the wafer to obtain a distribution of etching rates. Meanwhile, the etching rate at each position was determined from the film thickness of the silicon oxide film before and after processing, and the processing time.

Figure 9A:
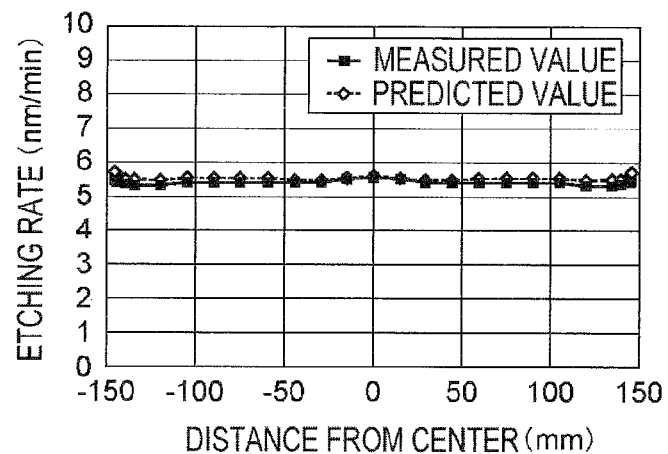
FIGS. 9A to 9C are graphs each illustrating a distribution of etching rates obtained in Test Example 1, Test Example 2, or Comparative Test Example 1.
Figure 9B:
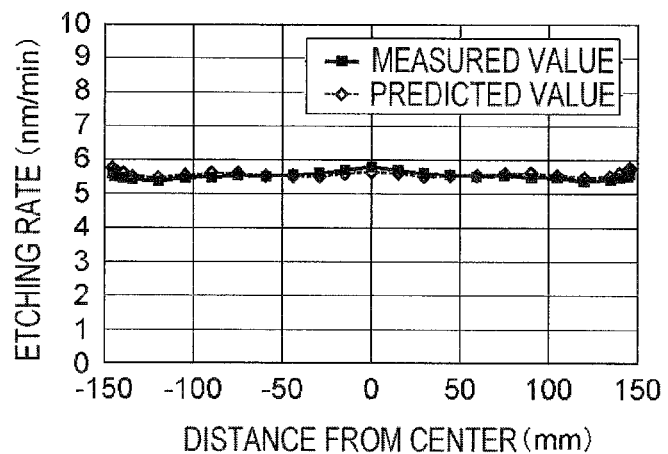
Figure 9C:
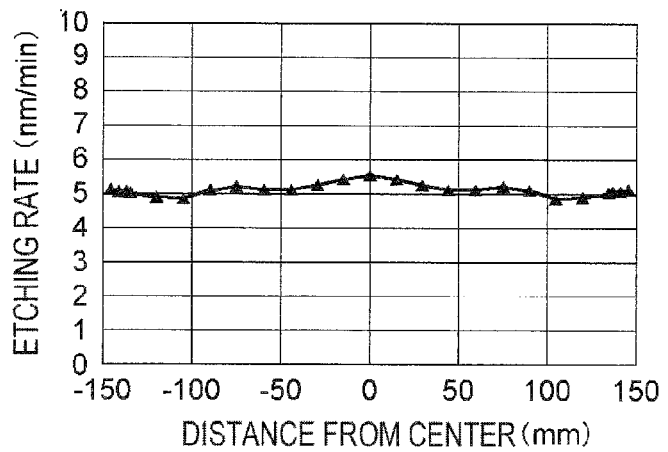
Figure 10A:
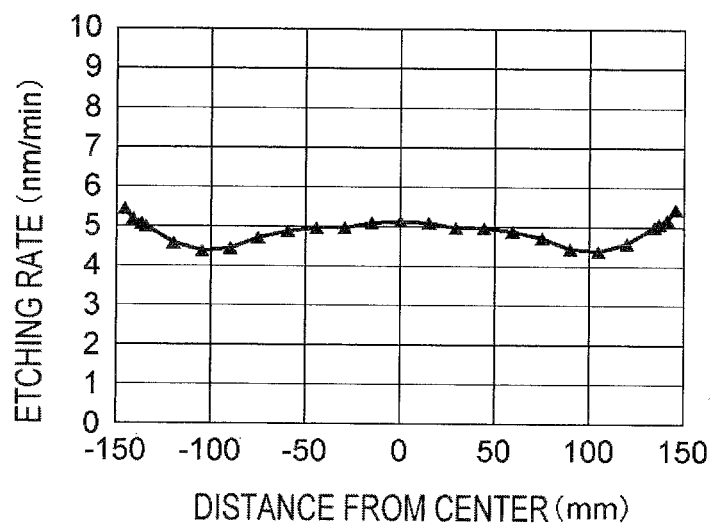
FIGS. 10A and 10B are graphs each illustrating a distribution of measured values of the etching rate used in calculation of predicted values of the etching rate.
Figure 10B:
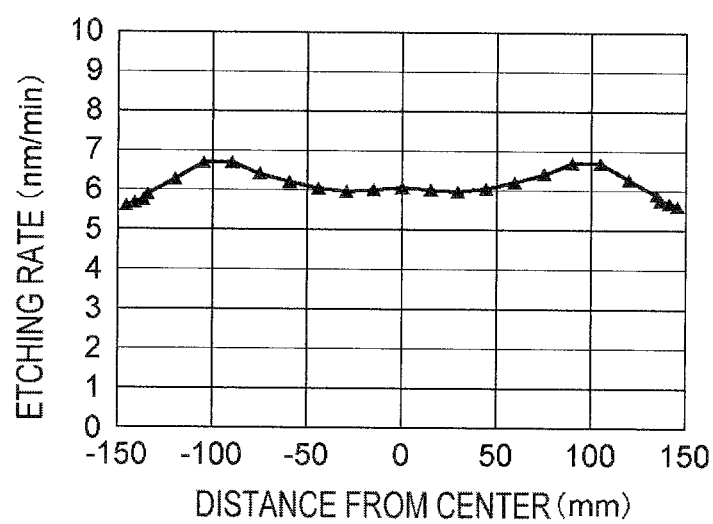

FIG. 9A illustrates a distribution of the etching rate obtained in Test Example 1. FIG. 9B illustrates a distribution of the etching rate obtained in Test Example 2. FIG. 9C illustrates a distribution of the etching rate obtained in Comparative Test Example. In FIGS. 9A to 9C, the vertical axis represents an etching rate, and the horizontal axis represents a distance from the center of the wafer in the diametric direction. The symbol of the distance (plus and minus) represents a direction along the diameter of the wafer with respect to the center of the wafer. Directions represented by the plus symbol and the minus symbol are opposite to each other. Further, measured values illustrated in FIGS. 9A and 9B are values of the etching rates obtained in Test Examples 1 and 2. Further, predicted values illustrated in FIGS. 9A and 9B are values of the etching rates obtained by calculation. Specifically, the predicted values in FIGS. 9A and 9B are values determined by adding a measured value obtained by a test in which plasma is generated under the same conditions as in step ST1 of Test Examples 1 and 2, and the current value of the coils 61 to 64 is fixed under the conditions of step ST211 of Test Examples 1 and 2 during the generation of the plasma (see FIG. 10A) and a measured value obtained by a test in which plasma is generated under the same conditions as in step ST1 of Test Examples 1 and 2, and the current value of the coils 61 to 64 is fixed under the conditions of step ST212 of Test Examples 1 and 2 during the generation of the plasma (see FIG. 10B).

The current supplied to the coils 61 to 64 in Comparative Test Example 1 was a current having a current value optimized to obtain a uniform distribution of the etching rate. However, as illustrated in FIG. 9C, the distribution of the etching rate of Comparative Test Example 1 had a local peak at a position which is about 75 mm apart from the center of the wafer. The average value of the etching rate of Comparative Test Example 1 was 5.1 mm, and the etching rate of Comparative Test Example 1 had ±6.3 variation with respect to the average value.

Meanwhile, as illustrated in FIGS. 9A and 9B, in the distribution of the etching rate of Test Examples 1 and 2, local peaks were suppressed. That is, in Test Examples 1 and 2, a distribution of the etching rate, which is not obtained when the current supplied to respective coils of the plurality of electromagnets is fixed during the generation of plasma of the processing gas, was obtained. The average value of the etching rate of Test Example 1 was 5.4 mm, and the etching rate of Test Example 1 had ±4.3 variation with respect to the average value. In addition, the average value of the etching rate of Test Example 2 was 5.5 mm, and the etching rate of Test Example 2 had ±4.4 variation with respect to the average value. Accordingly, it was confirmed that the etching rates of Test Examples 1 and 2 were uniform as compared with the etching rate of Comparative Test Example 1. Further, as illustrated in FIGS. 9A and 9B, the measured values obtained in Test Examples 1 and 2 were well-matched to the predicted values determined by calculation.

TEST EXAMPLE 3

Figure 11:
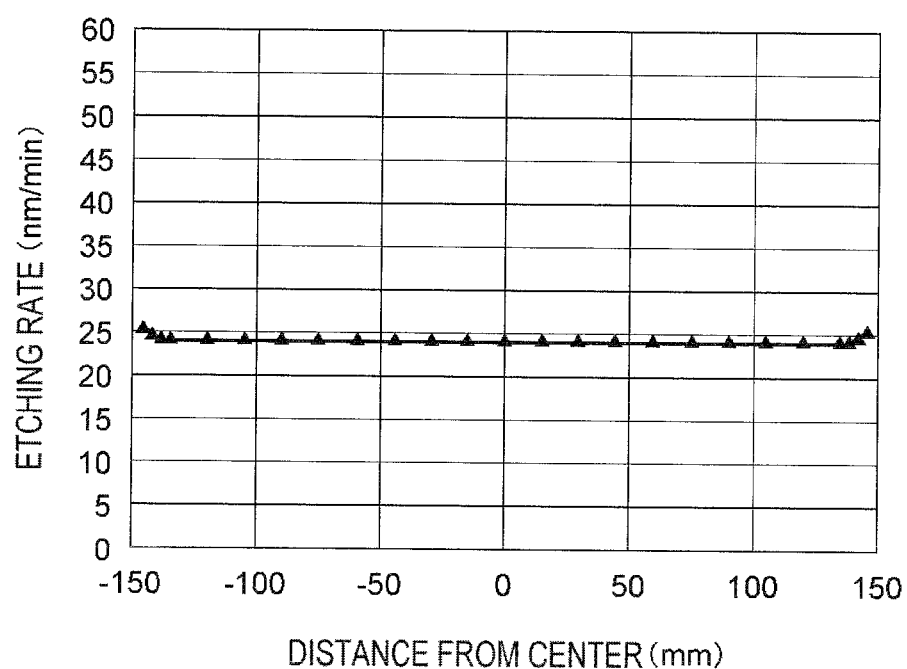
FIG. 11 is a graph illustrating a distribution of the etching rate obtained in Test Example 3.
Figure 12A:
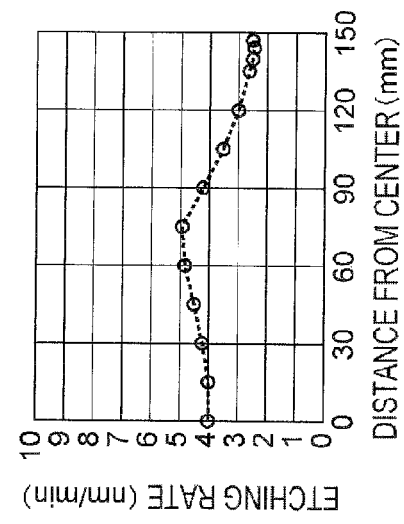
FIGS. 12A to 12F are graphs each illustrating a distribution of the etching rate obtained in the test.
Figure 12B:
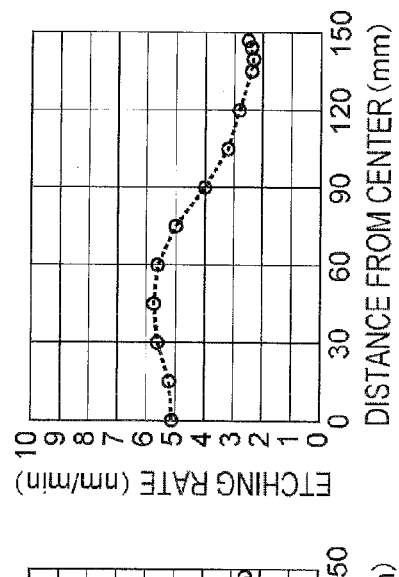
Figure 12C:
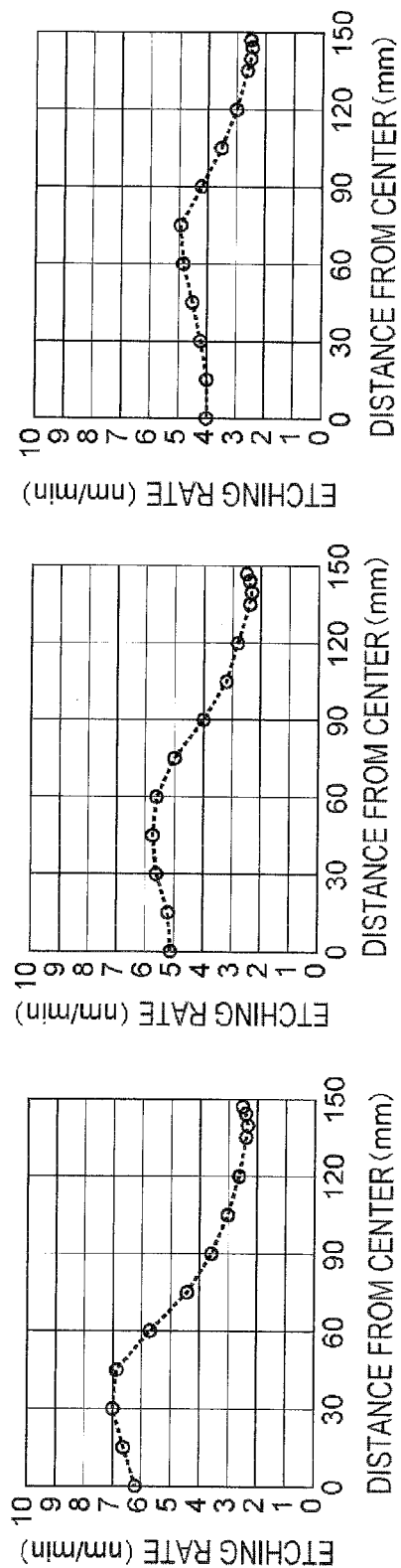
Figure 12D:
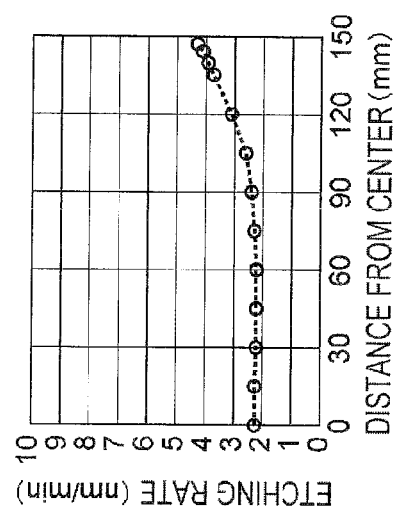
Figure 12E:
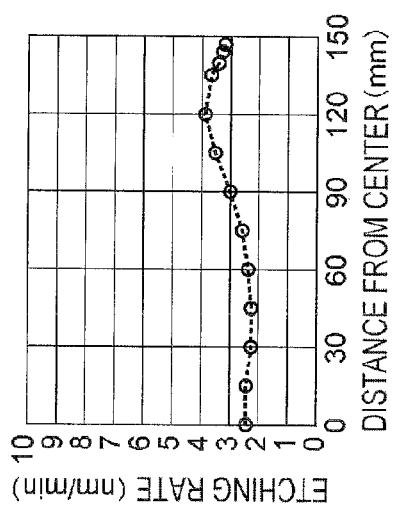
Figure 12F:
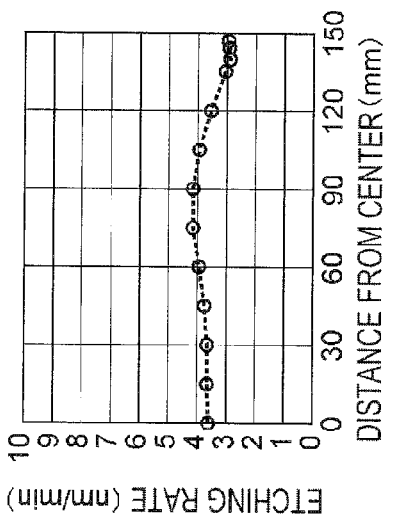

In Test Example 3, a 300 mm diameter wafer having a silicon oxide film was prepared, and the silicon oxide film was etched by method MT including step ST2 of FIG. 5 using the plasma processing apparatus 10. Conditions of each step in Test Example 3 are as follows. In each of Test Examples 1 and 2 as described above, the performance time length of step ST211 and the performance time length of step ST212 were the same as each other. However, as described below, in Test Example 3, the performance time length of step ST211 and the performance time length of step ST212 were different from each other.
<Conditions of Step ST1 in Test Example 3>
Processing gas
  $N_2$ gas: 300 sccm
  $O_2$ gas: 15 sccm
First high frequency waves: 100 MHz, 600 W
Second high frequency waves: 13.56 MHz, 4,500 W
Pressure in processing container 12: 20 mT (2.666 Pa)
<Conditions of Step ST211 in Test Example 3>
Magnetomotive force of coil 61: 0 (AT)
Magnetomotive force of coil 62: 0 (AT)
Magnetomotive force of coil 63: 0 (AT)
Magnetomotive force of coil 64: 432 (AT)
<Conditions of Step ST212 in Test Example 3>
Magnetomotive force of coil 61: 283 (AT)
Magnetomotive force of coil 62: 238 (AT)
Magnetomotive force of coil 63: 198 (AT)
Magnetomotive force of coil 64: 115 (AT)
<Conditions of Step ST2 in Test Example 1>
Performance time length of step ST211 in each sequence SQ1: 2 seconds
Performance time length of step ST212 in each sequence SQ1: 1 seconds
Number of times of performance of sequence SQ1: 10 times Then, in Test Example 3, the etching rate of the silicon oxide film was measured at a plurality of positions along the diameter of the wafer to obtain a distribution of the etching rate. The result is illustrated in FIG. 11. As illustrated in FIG. 11, even in Test Example 3 in which the performance time length of step ST211 and the performance time length of step ST212 were different from each other, a distribution of the etching rate with suppressed lock peaks was obtained. That is, even in Test Example 3, a distribution of the etching rate, which is not obtained when the current supplied to respective coils of the plurality of electromagnets is fixed during the generation of plasma of the processing gas, was obtained. The average value of the etching rate of Test Example 3 was 24.2 mm, and the etching rate of Test Example 3 had ±3.4 variation with respect to the average value.

[Simulation]

Six 300 mm diameter wafers each having a silicon oxide film were prepared, and the silicon oxide films were etched using the plasma processing apparatus 10. Specifically, the silicon oxide films of the six wafers were etched under the first to sixth settings with respect to the coils 61 to 64. Conditions for the etching of the silicon oxide films are as follows.

Processing gas
  $N_2$ gas: 300 sccm
  $O_2$ gas: 15 sccm
First high frequency waves: 100 MHz, 600 W
Second high frequency waves: 13.56 MHz, 300 W
Pressure in processing container 12: 20 mT (2.666 Pa)
First setting
  Magnetomotive force of coil 61: 1272 (AT)
  Magnetomotive force of coil 62: 0 (AT)
  Magnetomotive force of coil 63: 0 (AT)
  Magnetomotive force of coil 64: 0 (AT)
Second setting
  Magnetomotive force of coil 61: 707 (AT)
  Magnetomotive force of coil 62: 340 (AT)
  Magnetomotive force of coil 63: 0 (AT)
  Magnetomotive force of coil 64: 0 (AT)
Third setting
  Magnetomotive force of coil 61: 0 (AT)
  Magnetomotive force of coil 62: 679 (AT)
  Magnetomotive force of coil 63: 0 (AT)
  Magnetomotive force of coil 64: 0 (AT)
Fourth setting
  Magnetomotive force of coil 61: 0 (AT)
  Magnetomotive force of coil 62: 340 (AT)
  Magnetomotive force of coil 63: 283 (AT)
  Magnetomotive force of coil 64: 0 (AT)
Fifth setting
  Magnetomotive force of coil 61: 0 (AT)
  Magnetomotive force of coil 62: 0 (AT)
  Magnetomotive force of coil 63: 764 (AT)
  Magnetomotive force of coil 64: 0 (AT)
sixth setting
  Magnetomotive force of coil 61: 0 (AT)
  Magnetomotive force of coil 62: 0 (AT)
  Magnetomotive force of coil 63: 0 (AT)
  Magnetomotive force of coil 64: 807 (AT)

FIGS. 12A to 12F illustrates a distribution of the etching rate (measured values) of the silicon oxide film obtained using the first to sixth settings. When a coil imparting a current was changed from a central coil to an outside coil among the coils 61 to 64, the position of the peak of the etching rate could be moved from the vicinity of the center of the wafer to the edge side thereof, as illustrated in FIGS. 12A to 12F.

Figure 13:
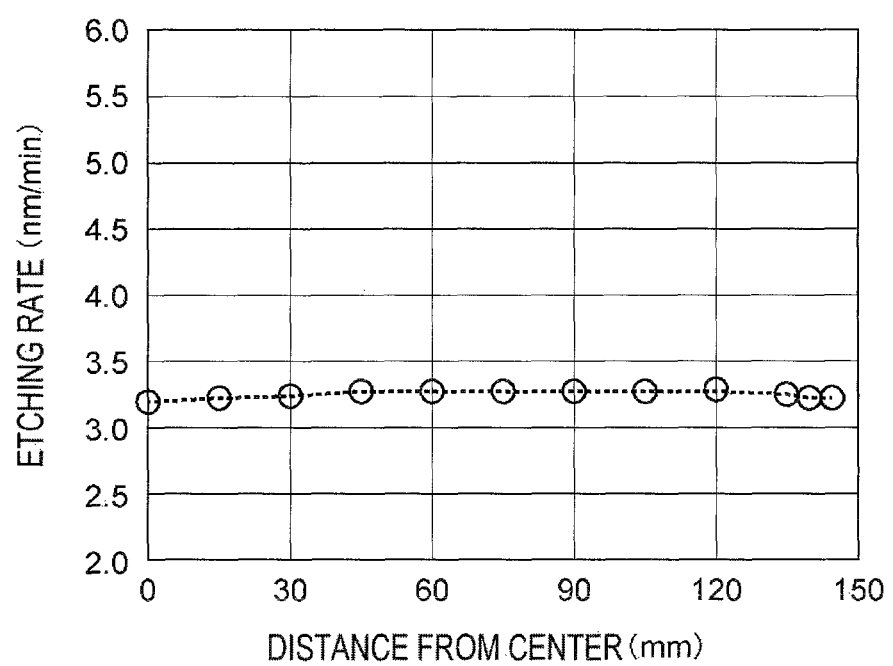
FIG. 13 is a graph illustrating a distribution of the predicted values of the etching rate determined in a simulation.

Then, in the simulation of step ST2 illustrated in FIG. 6, a distribution of predicted values of the etching rate was determined. Specifically, the predicted values of the etching rate of the silicon oxide film at each position of the wafer when step ST22(1) for 4 seconds as the first setting, step ST22(2) for 4 seconds as the second setting, step ST22(3) for 4 seconds as the third setting, step ST(4) for 15 seconds as the fourth setting, step ST(5) for 15 seconds as the fifth setting, and step ST22(6) for 18 seconds as the sixth setting were performed in sequence, were determined by weight-addition of the above-described etching rate (measured value) of the silicon oxide film at each position of the wafer obtained using the first to sixth settings. In the weight-addition, the etching rate (measured value) of each of steps ST22(1) to ST22(6) was multiplied by a weight corresponding to the processing time of each of steps ST22(1) to ST22(6). The distribution of the predicted values of the etching rate obtained by the simulation is illustrated in FIG. 13. As illustrated in FIG. 13, according to the simulation, it has been confirmed that a uniform distribution of the etching rate is obtained by step ST2 illustrated in FIG. 6. According to the relationship between the measured values and the predicted values of the etching rate in Test Examples 1 and 2 as described above, it is presumed that the predicted values obtained by addition of the measured values of the etching rate are well-matched to the measured values of the etching rate obtained when step ST2 is performed in practice.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma etching method which is performed using a plasma processing apparatus that is a capacitively coupled plasma processing apparatus, the plasma processing apparatus comprising:
   a processing container;
   a gas supply unit configured to supply an etching processing gas into the processing container;
   a placing table including a lower electrode provided in the processing container;
   an upper electrode provided above the placing table; and
   a plurality of electromagnets including a plurality of coils provided coaxially around a central axis passing through a center of the placing table in a vertical direction, on the upper electrode,
   the method further comprising:
     generating plasma of the processing gas to perform a plasma etching on a single film of a workpiece placed on the placing table; and
     repeatedly controlling a current supplied to each of the plurality of electromagnets to change a distribution of an etching rate of the single film in the diametric direction with respect to the central axis during the generating of the plasma of the processing gas.

2. The plasma etching method of claim 1, wherein the controlling of the current supplied to each of the plurality of electromagnets comprises: a first step of setting the current supplied to the plurality of electromagnets to etch the single film with a distribution of a first etching rate as the distribution of the etching rate, and a second step of setting the current supplied to the plurality of electromagnets to etch the single film with a distribution of a second etching rate different from the first distribution of the first etching rate, as the distribution of the etching rate, and wherein the first step and the second step are alternately performed.

3. The plasma etching method of claim 1, wherein the controlling of the current supplied to each of the plurality of electromagnets includes a plurality of steps of setting the current supplied to the plurality of electromagnets to sequentially etch the single film with a plurality of different etching rates in the diametric direction.

4. A plasma etching method, comprising:
generating plasma of the processing gas to perform a plasma etching on a single film of a workpiece placed on the placing table; and
controlling a current supplied to each of a plurality of electromagnet to change a distribution of an etching rate of the single film in a diametric direction with respect to a central axis during the generating of the plasma of the processing gas,
wherein the controlling of the current supplied to the plurality of electromagnet includes a plurality of steps of setting the current supplied to the plurality of electromagnets to sequentially etch the single film with a plurality of different etching rates in the diametric direction; and
wherein the plurality of steps of setting the current supplied to the plurality of electromagnets are repeated.

5. The plasma etching method of claim 4, wherein the plurality of electromagnets each includes a coil extending about a circumferential direction around the central axis, and the coils of the electromagnets are at different radial distances from the central axis.

6. The plasma etching method of claim 1, wherein the plurality of electromagnets each includes a coil extending about a circumferential direction around the central axis, and the coils of the electromagnets are at different radial distances from the central axis.

* * * * *